US009479202B2

(12) United States Patent
Mertens et al.

(10) Patent No.: US 9,479,202 B2
(45) Date of Patent: Oct. 25, 2016

(54) SYSTEM AND METHOD FOR BURST MODE AMPLIFIER

(75) Inventors: Koen Mertens, Villach (AT); Thomas Poetscher, Villach (AT)

(73) Assignee: Infineon Technologies AG, Neubiberg (DE)

( * ) Notice: Subject to any disclaimer, the term of this patent is extended or adjusted under 35 U.S.C. 154(b) by 2659 days.

(21) Appl. No.: 12/033,700

(22) Filed: Feb. 19, 2008

(65) Prior Publication Data
US 2009/0207939 A1 Aug. 20, 2009

(51) Int. Cl.
*H04B 1/04* (2006.01)
*H03F 3/195* (2006.01)
*H03F 3/217* (2006.01)
*H03F 3/24* (2006.01)
*H03F 3/45* (2006.01)

(52) U.S. Cl.
CPC ............ *H04B 1/0458* (2013.01); *H03F 3/195* (2013.01); *H03F 3/2171* (2013.01); *H03F 3/245* (2013.01); *H03F 3/45179* (2013.01); *H03F 2200/09* (2013.01); *H03F 2200/318* (2013.01); *H03F 2200/451* (2013.01); *H03F 2200/541* (2013.01); *H03F 2203/45394* (2013.01); *H03F 2203/45396* (2013.01); *H03F 2203/45731* (2013.01)

(58) Field of Classification Search
CPC ... H04B 1/0458; H03F 3/195; H03F 3/2171; H03F 3/245; H03F 3/45179; H03F 2200/09; H03F 2200/318; H03F 2200/451; H03F 2200/541; H03F 2203/45394; H03F 2203/45396; H03F 2203/45731
USPC .......... 375/132, 297; 330/10, 127–129, 251; 455/78, 82, 121
See application file for complete search history.

(56) References Cited

U.S. PATENT DOCUMENTS

| | | | |
|---|---|---|---|
| 3,919,656 A | 11/1975 | Sokal et al. | |
| 5,023,566 A | 6/1991 | El-Hamamsy et al. | |
| 5,187,580 A | 2/1993 | Porter, Jr. et al. | |
| 5,747,935 A | 5/1998 | Porter et al. | |
| 5,847,602 A | 12/1998 | Su | |
| 5,861,777 A | 1/1999 | Sigmon et al. | |
| 5,936,464 A * | 8/1999 | Grondahl | H03F 1/0222 330/10 |
| 6,198,347 B1 | 3/2001 | Sander et al. | |
| 6,256,482 B1 | 7/2001 | Raab | |
| 6,377,784 B2 | 4/2002 | McCune | |
| 6,388,512 B1 | 5/2002 | Sims, II | |
| 6,392,488 B1 | 5/2002 | Dupuis et al. | |
| 6,448,847 B1 | 9/2002 | Paul et al. | |
| 6,462,620 B1 | 10/2002 | Dupuis et al. | |
| 6,515,540 B1 | 2/2003 | Prasad et al. | |
| 6,628,166 B2 | 9/2003 | Delano | |
| 6,636,112 B1 | 10/2003 | McCune | |
| 6,658,265 B1 * | 12/2003 | Steel | H03F 3/191 455/552.1 |
| 6,681,101 B1 | 1/2004 | Eidson et al. | |
| 6,806,767 B2 | 10/2004 | Dow | |

(Continued)

OTHER PUBLICATIONS

Mertens, K. L. R., et al., "A 700-MHz 1-W Fully Differential CMOS Class-E Power Amplifier," IEEE Journal of Solid-State Circuits, Feb. 2002, pp. 137-141, vol. 37, No. 2.

(Continued)

*Primary Examiner* — Daniel Washburn
*Assistant Examiner* — Eboni Hughes
(74) *Attorney, Agent, or Firm* — Slater Matsil, LLP

(57) ABSTRACT

Embodiments related to burst mode amplifying are described and depicted.

28 Claims, 6 Drawing Sheets

(56) References Cited

U.S. PATENT DOCUMENTS

| | | | |
|---|---|---|---|
| 6,816,016 | B2 | 11/2004 | Sander et al. |
| 6,952,144 | B2* | 10/2005 | Javor ..................... H03F 1/56 |
| | | | 330/144 |
| 6,993,087 | B2 | 1/2006 | Rosnell et al. |
| 7,058,373 | B2 | 6/2006 | Grigore |
| 7,177,370 | B2* | 2/2007 | Zhang et al. ................ 375/297 |
| 7,212,069 | B2 | 5/2007 | Schell et al. |
| 7,224,232 | B2 | 5/2007 | Paul et al. |
| 7,679,434 | B2* | 3/2010 | Reynaert ................. H03F 1/56 |
| | | | 330/10 |
| 2002/0101907 | A1* | 8/2002 | Dent ...................... H03F 3/24 |
| | | | 375/132 |
| 2005/0186919 | A1 | 8/2005 | Kobayashi et al. |
| 2006/0028269 | A1 | 2/2006 | Chen |
| 2006/0214732 | A1* | 9/2006 | Pengelly et al. ............ 330/295 |
| 2007/0188224 | A1* | 8/2007 | Dow et al. ................. 330/129 |
| 2008/0001660 | A1* | 1/2008 | Rasmussen ................. 330/10 |
| 2008/0180168 | A1* | 7/2008 | Itkin et al. ............... 330/124 R |
| 2008/0261544 | A1* | 10/2008 | Blin ...................... H01Q 1/242 |
| | | | 455/121 |
| 2009/0096525 | A1* | 4/2009 | Staszewski et al. .......... 330/277 |
| 2010/0308933 | A1* | 12/2010 | See ....................... H03F 1/565 |
| | | | 333/32 |
| 2011/0003563 | A1* | 1/2011 | Gorbachov ............. H01Q 21/0025 |
| | | | 455/78 |

OTHER PUBLICATIONS

Raab, F. H., "Effects of Circuit Variations on the Class E Tuned Power Amplifier," IEEE Journal of Solid-State Circuits, Apr. 1978, pp. 239-247, vol. SC-13, No. 2.

Rosnell, S., et al., "Bandpass Pulse-Width Modulation (BP-PWM)," 2005 IEEE MTT-S International Microwave Symposium Digest, Jun. 12-17, 2005, pp. 731-734.

Sokal, N. O., et al., "Class E-A New Class of High-Efficiency Tuned Single-Ended Switching Power Amplifiers," IEEE Journal of Solid-State Circuits, Jun. 1975, pp. 168-176, vol. SC-10, No. 3.

Su, D., et al., "A 2.5-V, 1-W Monolithic CMOS RF Power Amplifier," IEEE 1997 Custom Integrated Circuits Conference, May 5-7, 1997, pp. 189-192.

Tsai, K. C., et al., "A 1.9-GHz, 1-W CMOS Class-E Power Amplifier for Wireless Communications," IEEE Journal of Solid-State Circuits, Jul. 1999, pp. 962-970, vol. 34, No. 7.

Yoo, C., et al., "A Common-Gate Switched 0.9-W Class-E Power Amplifier with 41% PAE in 0.25-μm CMOS," IEEE Journal of Solid-State Circuits, May 2001, pp. 823-830, vol. 36, No. 5.

* cited by examiner

SYSTEM AND METHOD FOR BURST MODE AMPLIFIER

TECHNICAL FIELD

This invention relates generally to RF communication systems and more particularly to a system and method for a burst mode amplifier.

BACKGROUND

Third and higher generation base station transmitters for applications, such as cellular telephone and other wireless communications typically use bandwidth-optimized modulation schemes for transmitting information. Bandwidth-optimized modulation schemes, such as CDMA, require a non-constant envelope and must operate a high peak-to-average ratio (PAR). Linear power amplifiers, such as class AB amplifiers are typically used in such systems because they offer high linearity, however, class AB amplifiers must be driven with a high back off, and, therefore, suffer from poor power efficiency. Class AB amplifiers must also be sized and biased to handle high peak power levels, even though they are often operated at much lower average powers. Currently, most state of the art base stations systems have a power efficiency of only 30%. This poor power efficiency results in high costs to build and operate base station systems.

The power efficiency of base station transmission systems can be improved by using alternative RF amplification systems and structures. In fact, power efficiency can be improved if a switched-mode amplifier, such as a class-F, an inverse class-F, or a class-D amplifier is used instead of a conventional class AB amplifier. A switched-mode amplifier is more efficient than a class AB amplifier because more of the amplifiers full dynamic range is utilized during operation and because current and voltage peaks do not occur simultaneously. In systems where bandwidth-efficient modulation schemes are required, such as in UMTS base stations, a special modulator must be developed to modulate both the time dependent phase and amplitude information in the time domain.

A number of prior art systems have been proposed and developed in order to utilize more power efficient amplifier architectures for bandwidth efficient modulation schemes. One solution, known as Envelope Elimination and Restoration (EER), separately modulates the phase and amplitude of the desired output. In EER, a constant envelope phase modulated signal is created along with a separate amplitude or envelope signal. The constant envelope phase modulated signal is then used to drive the input of a power amplifier, and the envelope signal is applied to adaptively change the bias or power supply of the power amplifier output stage. These bias or power supply regulation techniques, however, still suffer from poor power efficiency. Furthermore, EER becomes more difficult to implement and even more power inefficient as the modulation bandwidth increases. Wideband CDMA, for example has a modulation bandwidth of about 50 MHz, which is generally too high for the practical use of EER techniques.

Another solution to the power efficiency problem of bandwidth-efficient modulation is to use pulse-width modulation with a switched-mode power amplifier. Amplitude modulation is imparted at the amplifier output by varying the duty cycle of the pulse width modulated signal applied to the amplifier input. Pulse width modulation can be applied to a signal by using conventional pulse width modulation techniques (PWM) or by using delta-sigma modulation techniques. Delta Sigma modulation, however, tends to be less efficient then its PWM counterpart, which can offer power efficiencies of up to 60%.

PWM techniques, for all of its power efficiency advantages, suffer from a number of practical implementation difficulties. One difficulty involves the processing of RF pulses through a chain of RF amplifiers. Ideally, a PWM transmission system should comprise a very high bandwidth RF signal path system followed by a high order transmit filter. In reality, matching networks and bias networks limit the system's bandwidth and provide resonances that may demodulate and degrade the ideality of the PWM signals along the signal path. Generally, the more a PWM signal is degraded and departs from its constant envelope character, the lower the system's power efficiency and the worse the system's signal integrity becomes.

In the field of RF communication systems, what are needed are circuit system techniques for the effective implementation of PWM systems which implement bandwidth efficient modulation schemes.

SUMMARY OF THE INVENTION

In one embodiment, a system for amplifying a burst mode RF signal is disclosed. The system has a first amplifier configured to amplify a burst mode signal provided at its input, a switchable impedance element coupled to an output of the first amplifier, and a second amplifier coupled to the output of the first amplifier. The switchable impedance element comprises a first impedance when the burst mode signal is active, and a second impedance when the burst mode signal is inactive.

The foregoing has outlined, rather broadly, features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely a system and method for amplifying burst mode RF signals in a wireless communication system. This invention may also be applied to amplification systems where the system has a time varying gain or impedance characteristic, or in a pulse-width or oversampling modulation system. Embodiments of the present invention can also be used in applications outside of the field of wireless communication systems, for example in cable communication systems, audio systems, or other systems employing a switched-mode characteristic.

Figure 1A:
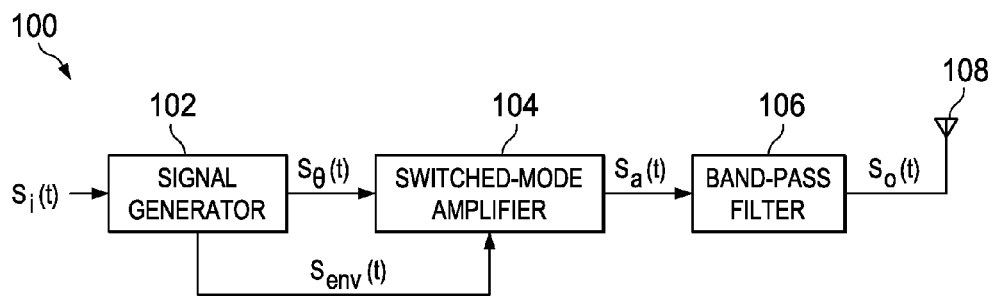
FIGS. 1a and 1b illustrate a system diagram and a signal generator according to an embodiment of the present invention.

A system 100 for transmitting a bandwidth-efficient modulation scheme using PWM signals is shown in FIG. 1a. System 100 contains signal generator 102, a switched-mode amplifier 104, band-pass filter 106, and antenna 108. Signal generator 102 converts signal $S_i(t)$ into phase component $S_\theta(t)$ and amplitude or envelope component $S_{env}(t)$. Signal $S_i(t)$ is representative of any modulation scheme. In embodiments of the present invention, modulation schemes which implement bandwidth efficient modulation schemes such as CMDA, WB CDMA, UTMS, LTE and WIMAX are used. These bandwidth-efficient modulation schemes typically modulate the phase and amplitude of the signal using PSK, BPSK QPSK, M-ary PSK or QAM. It should be noted that even if an initially constant envelope modulation scheme, such as OPSK is used, the resulting signal may not result in a constant envelope signal because of processing performed by digital transmit filters. In alternative embodiments of the present invention, other modulation schemes such as AM, FM could be used.

In embodiments of the present invention, signal generator 102 is a pulse width modulator. Constant envelope phase signal $S_\theta(t)$ containing the phase information of $S_i(t)$ is output from signal generator 102 to switched-mode amplifier 104. $S_{env}(t)$, which may be a constant envelope pulse-width modulated waveform resembling a digital signal, is coupled to switched-mode amplifier 104. The chain of amplifiers within switched-mode amplifier 104 may contain at least one preamplifier and a power amplifier. In alternative embodiments of the present invention, $S_{env}(t)$ may comprise a multi-level envelope signal and switched-mode amplifier 104 may comprise only one stage, or more than two stages.

In embodiments of the present invention, system 100 is configured to function as a transmitter within an UTMS base station. For example, switched-mode amplifier 104 can be required to output between 45 dBm and 60 dBm of output power. In order to achieve this level of output power, two or three stages of amplification of about 15 dB per stage are typically required within switched-mode amplifier 104. In embodiments, these amplifier stages are implemented using LDMOS technology. In alternative embodiments of the present invention, more or less stages of amplification using various gain profiles may be used, and different devices and technologies may be used, for example, MOS, bipolar or MESFET devices, using technologies such as silicon, SOI, or GaAs, as examples.

The output of switched-mode amplifier 104, $S_a(t)$, drives band-pass filter 106. Band-pass filter 106 may be a high-order band-pass filter because pulse-width modulated signals generally have a much wider spectrum than transmitted signal $S_o(t)$. Band-pass filter 106 is typically a cavity filter with a bandwidth of about 50 MHz in embodiments that utilize WB CDMA. In alternative embodiments of the present invention, other bandwidths and filter architectures can be used, and/or the band-pass filter 106 may be omitted.

In wireless RF systems, antenna 108 transmits signal $S_o(t)$ over the air. Output of $S_o(t)$ band-pass filter 106 may be coupled directly to antenna 108, or may be coupled indirectly to antenna 108 via matching networks, or combining networks, or other circuitry. In alternative embodiments of the present invention, $S_o(t)$ may be routed to an additional amplification stage or used to drive another transmission medium, such as a transmission line, a waveguide, or an optical path.

Figure 1B:
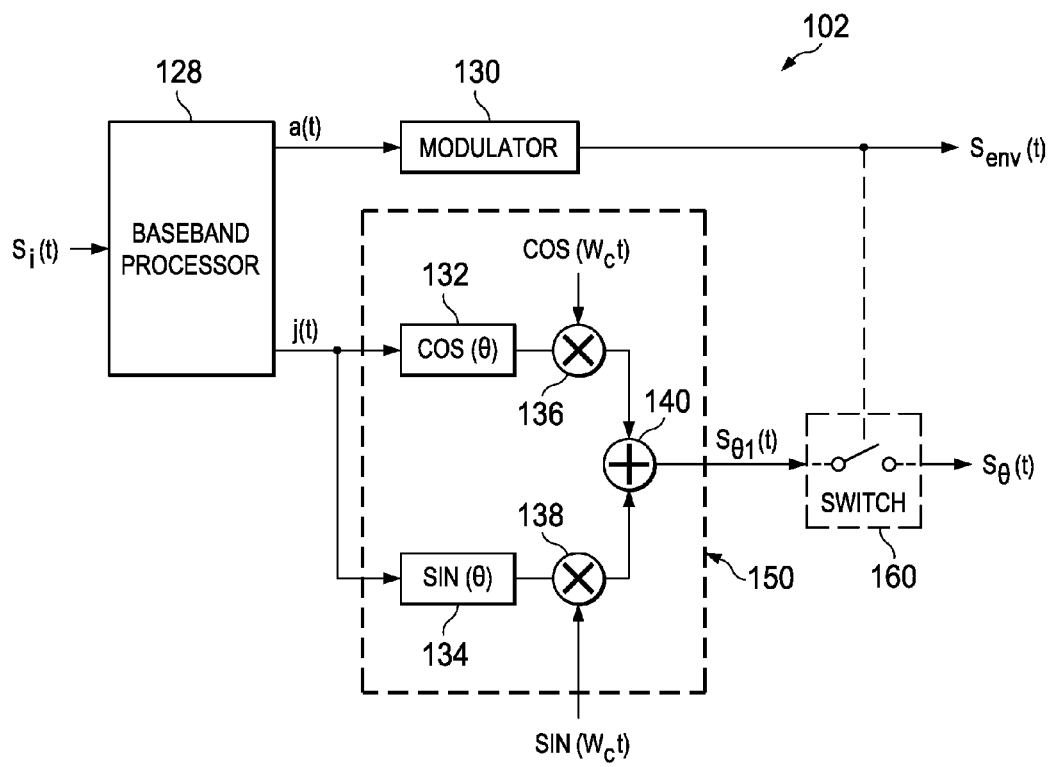

Turning to FIG. 1b, signal generator 102 is illustrated according to an embodiment of the present invention. Signal generator 102 includes baseband processor 128, modulator 130, quadrature modulator 150, and switch 160. Baseband processor 128 extracts separate amplitude a(t) and phase j(t) information from input signal $S_i(t)$. Modulator 130 outputs an envelope signal $S_{env}(t)$ based on extracted amplitude a(t). In embodiments of the present invention, modulator 130 comprises a pulse-width modulator implementing pulse-width modulation techniques known in the art, for example, using digital techniques. Alternatively, modulator 130 can comprise other modulator architectures such as a delta-sigma modulator, a multi-level pulse width modulator, or another architecture utilizing pulse width modulation techniques.

Envelope signal $S_{env}(t)$ controls the activation of switch 160, which allows phase signal $S_{\theta 1}(t)$ to pass when switch 160 is activated by envelope signal $S_{env}(t)$. Phase signal $S_\theta(t)$ is, therefore a pulse width modulated signal having a variable duty cycle corresponding to changes in the amplitude of input signal $S_i(t)$. In embodiments of the present invention, both amplitude signal $S_{env}(t)$ and phase signal $S_\theta(t)$ are applied to switched-mode amplifier 104 (FIG. 1a). In embodiments of the present invention, however, only $S_\theta(t)$ may be applied as described hereinbelow.

In embodiments of the present invention, phase modulation is imparted to phase signal $S_\theta(t)$ by quadrature modulator 150. Quadrature modulator 150 may include in-phase mixer 136 and quadrature mixer 138. The outputs in-phase mixer 136 and quadrature mixer 138 are summed together by summer 140 to form phase signal $S_{\theta 1}(t)$ based on phase information j(t) derived from $S_i(t)$ using baseband processor 128. In alternative embodiments of the present invention, quadrature modulator 150 can be implemented in any manner known in the art. In further alternative embodiments, signal generator 102 can be implemented using other circuit techniques and methods known in the art. For example, phase signal $S_{\theta 1}(t)$ can be derived using PLL loops or frequency synthesizers.

Figure 2A:
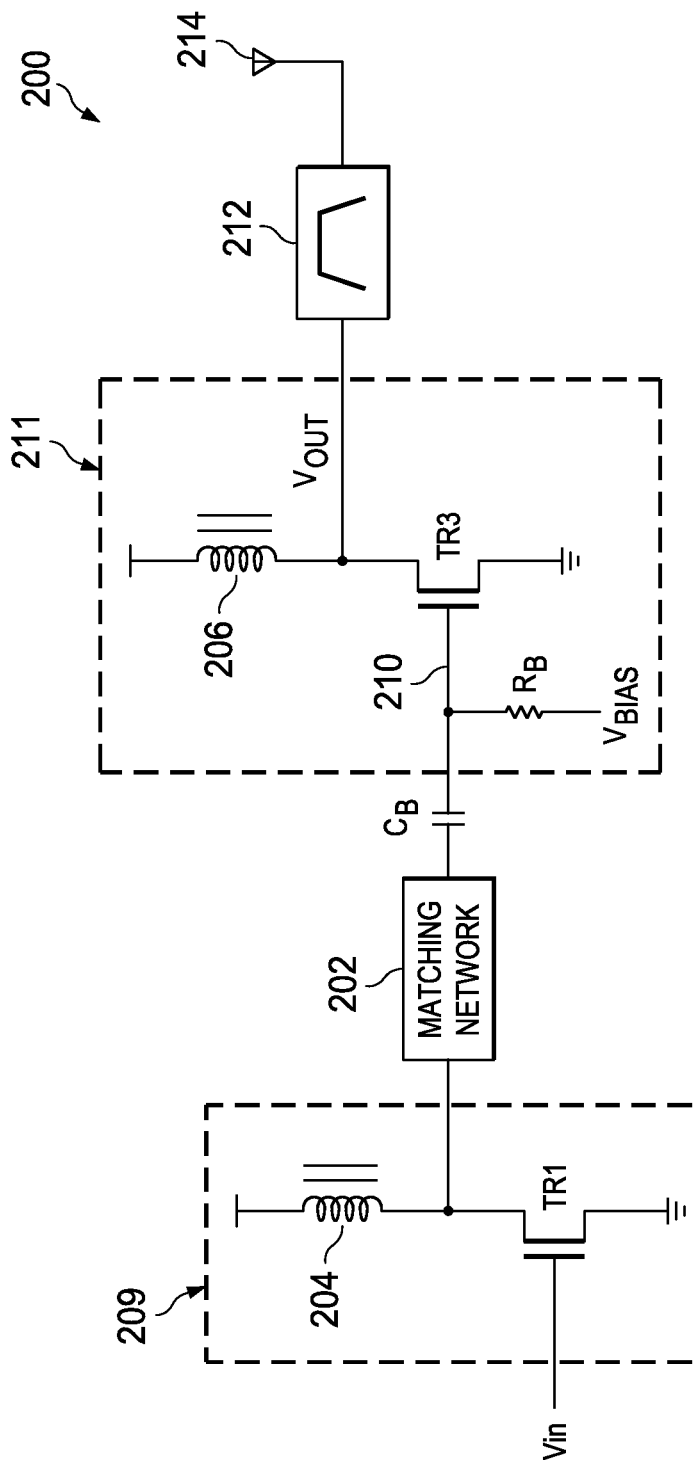
FIGS. 2a-2c illustrate a PWM amplifier circuit and its representative waveforms.

FIG. 2a illustrates a circuit implementation of a conventional switched-mode amplifier 200, which can be operated in a novel manner as taught by co-pending application Ser. No. 11/958,849, filed Dec. 18, 2007, entitled "Amplifier Modulation Method and Apparatus," which application is hereby incorporated herein by reference. Switched-mode amplifier 200 has preamplifier 209 containing input transistor TR1 loaded by RF choke 204. The output of preamplifier 209 is coupled to the input of power amplifier 211 which includes transistor TR3 loaded by RF choke 206, and biased by voltage $V_{BIAS}$ across bias resistor $R_B$. Inter-stage matching is provided by matching network 202 followed by AC coupling capacitor CB. Switched-mode amplifier 200 is biased according to biasing techniques known in the art. Because switched-mode amplifier 200 is used to amplify PWM signals, input terminal Vin at the gate of preamplifier transistor TR1 is coupled to a PWM signal, and high-order bandpass filter 212 is coupled to antenna 214.

Preamplifier transistor TR1 is typically driven so that the input to TR1 is below its threshold $V_T$ during periods of time in between pulses. This effectively shuts off TR1 to save power between pulses.

Figure 2B:
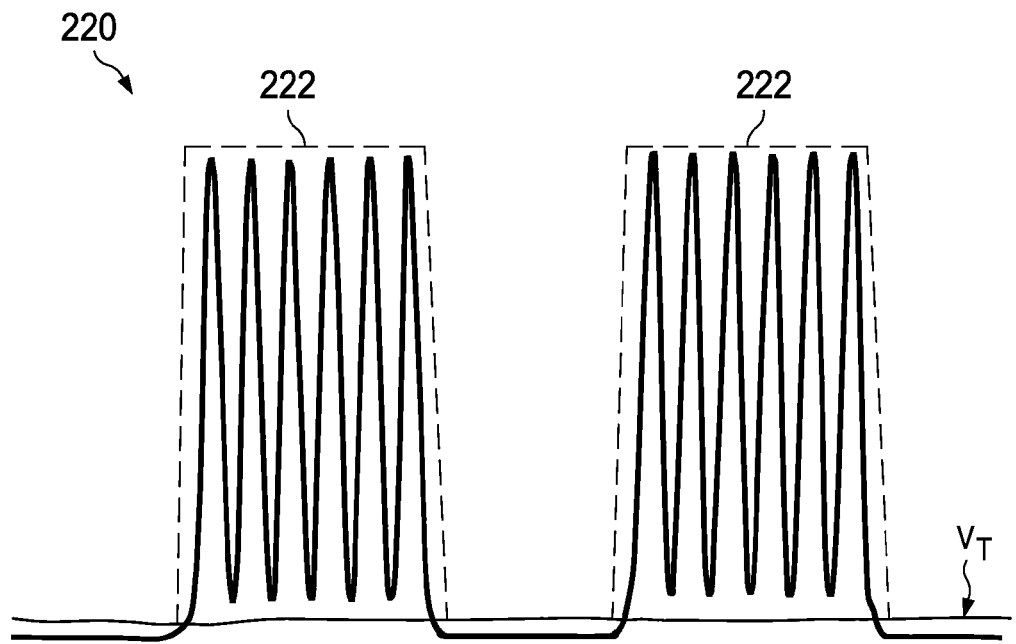
Figure 2C:
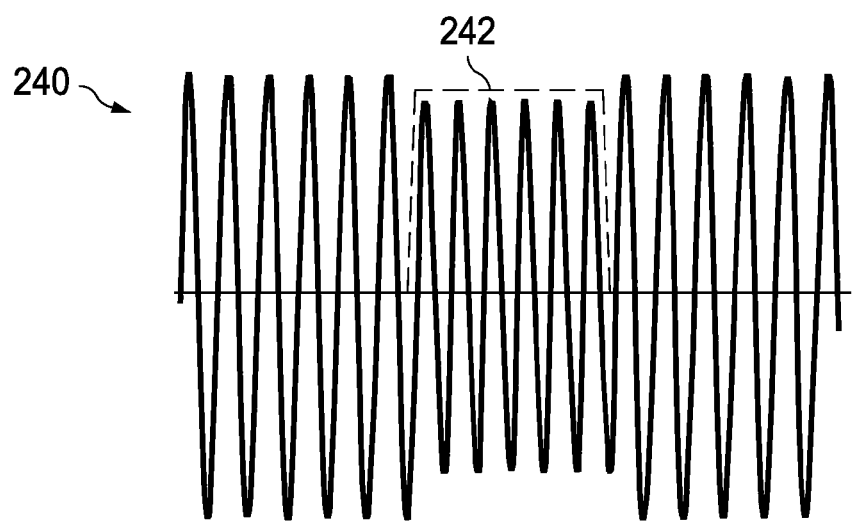

FIG. 2b illustrates PWM RF signal 220 present at input terminal Vin of switched-mode amplifier 200 (FIG. 2a). Signal 220 can correspond to $S_\theta(t)$ output from signal generator 102 (FIG. 1b). Signal 220 is characterized by a phase modulated tone with envelope 222 denoted by the dashed lines in FIG. 2b. A corresponding signal present at power amplifier input node 210 (FIG. 2a) is represented by signal 240 in FIG. 2c. By the time the signal has been amplified by preamplifier 209 and passes though matching network 202, demodulation 242 of the signal is clearly apparent. This demodulation can be caused by matching network 202 (FIG. 2a), or by the interaction between matching network 202, preamplifier 209 and power amplifier 211. Because signal is present during periods when no signal is desired, more power may be dissipated than necessary.

Figure 3A:
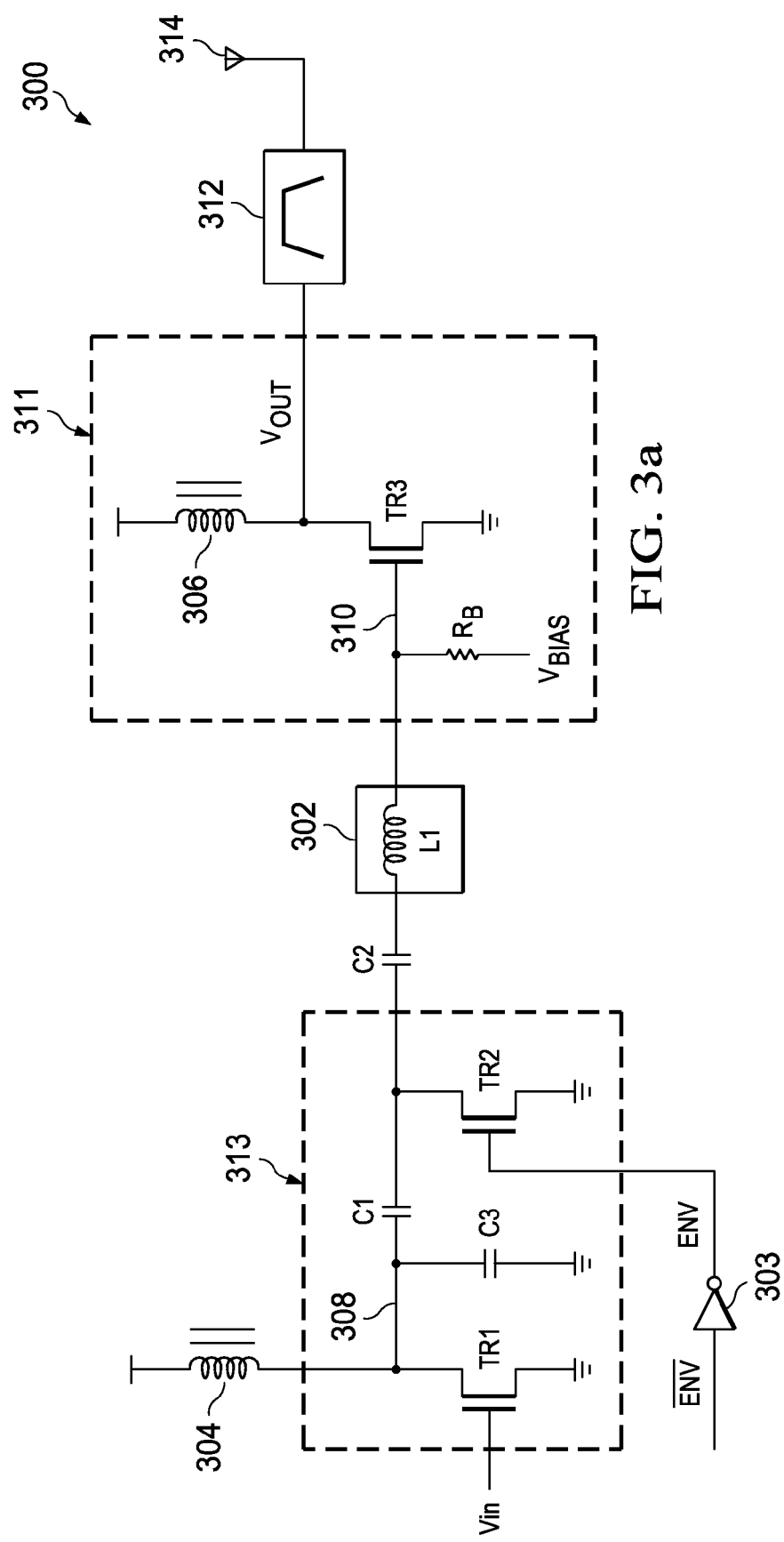
FIGS. 3a-3d illustrate a PWM amplifier circuit and its representative waveforms according to an embodiment of the present invention.

FIG. 3a illustrates switched-mode amplifier 300 according to an embodiment of the present invention. Similar to the conventional switched-mode amplifier 200, switched-mode amplifier 300 contains preamplifier 313 including input transistor TR1, matching network 302, and power amplifier 311 including output transistor TR3. However, in switched-mode amplifier 300, a switchable impedance element implemented by transistor TR2 is coupled to an output of the first amplifier. The switchable impedance element is provided to impart a first impedance when the burst mode signal is active and to impart a second impedance different from the first impedance when the burst mode signal is inactive. According to an embodiment of the present invention, transistor TR2 is coupled to the input of matching network 302 and the drain of input transistor TR1. AC coupling capacitors C1 and C2 are included to separate the DC bias networks of each transistor. RF chokes 304 and 306 provide bias current to preamplifier 313 and power amplifier 311, respectively, while maintaining high headroom and high impedance for passband signals.

Transistor TR2 is driven by signal ENV that corresponds to the envelope signal $S_{env}(t)$ output by signal generator 102 (FIG. 1b). In embodiments of the present invention, ENV is a digital signal that may be buffered by inverter 303. In alternative embodiments of the present invention, ENV may be driven by any manner of digital circuitry known in the art, or ENV may comprise an analog signal. Means for generating the envelope signal ENV may be included in the system to generate ENV corresponding to the burst signal.

Matching network 302 includes, according to embodiments, series inductor L1. Values for C1, C2, C3 and L1 may be chosen to be:

$$C1 = C2 = \frac{1}{\pi f_c R_S}$$

$$C3 = \frac{1}{2\pi R_i f_c \sqrt{\frac{R_S}{R_i - R_S}}}$$

$$L1 = \frac{R_S \left(1 + \sqrt{\frac{R_i - R_S}{R_S}}\right)}{2\pi f_c}$$

$R_S$ is the impedance looking into the drain of TR1 when TR1 is on, $R_i$ is the impedance looking into the gate of TR3, and $f_c$ is the carrier frequency of the system. It can be seen that parasitic capacitance of the drain of transistor TR1 contribute at least a part of the capacitance of C3. In alternative embodiments of the present invention, matching networks known in the art may be used.

In embodiments of the present invention, transistor TR2 is sized to impart a resistance of between about 5Ω and 20Ω, for example 10Ω, when transistor TR2 is on. The output impedance for TR2 is, according to embodiments, chosen to be similar or within an order of magnitude of the output impedance of TR1 when TR1 is on. According to embodiments, TR2 does not include a DC bias network, however, in alternative embodiments TR2 may be biased with a resistor, RF choke, or a current source, for example. In embodiments where TR2 is DC biased, there may be a design tradeoff between output resistance and power dissipation. In this case, the output impedance of TR2 may be chosen to be higher than the output impedance of TR1, as long as acceptable system performance is achieved. In alternative embodiments of the present invention, the output impedance of TR2 may even differ from the on impedance of TR1 by an order of magnitude.

Figure 3B:
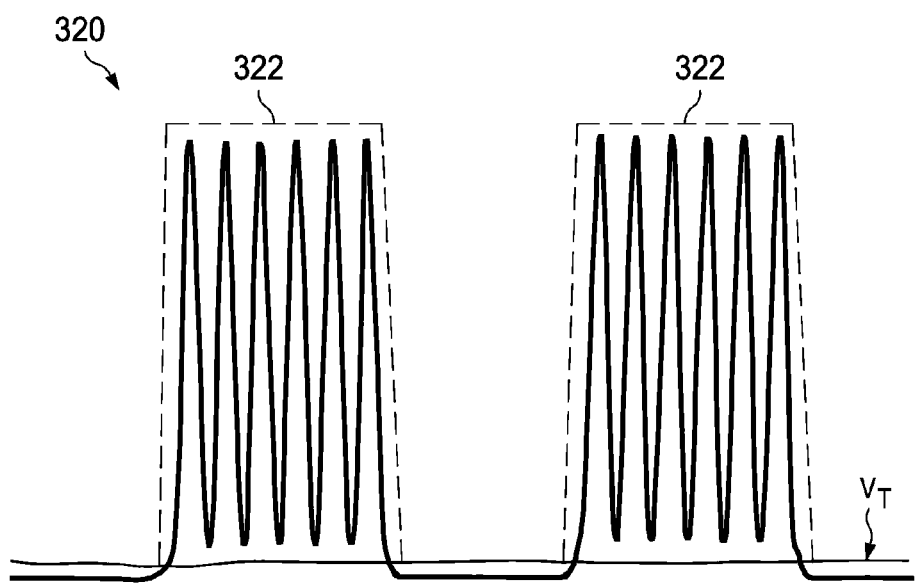
Figure 3C:
Figure 3D:
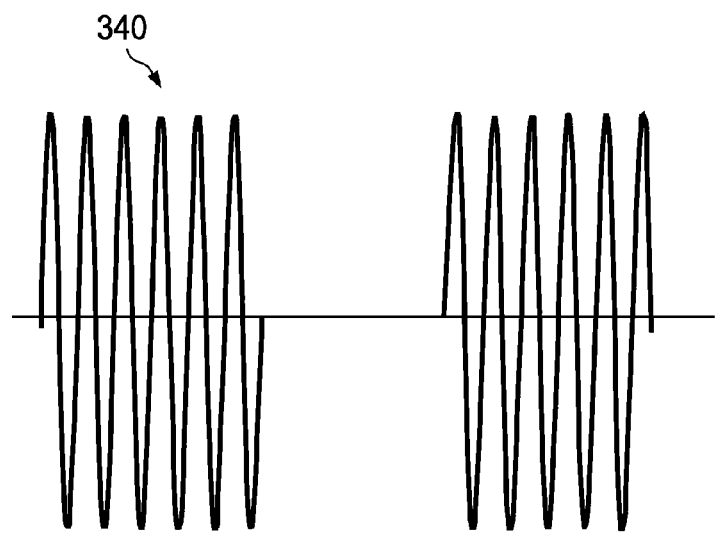

FIGS. 3b-3d illustrate intermediate signals within the signal path of switched-mode amplifier 300. FIG. 3b is shows a representative signal 320 present at the gate of transistor TR1, and is similar to FIG. 2b hereinabove. Signal 320 is a pulse-width modulated signal with envelope 322. Signal 320 is applied to the gate of transistor TR1 so that the voltage at the gate of transistor TR1 is below TR1's threshold $V_T$ during periods of time when the pulse is inactive, for example during time periods outside of envelope 322.

FIG. 3c illustrates a timing diagram of the signal 330 which corresponds to the ENV signal applied to the gate of TR2.

FIG. 3d illustrates signal 340 which corresponds to node 310 at the input to power amplifier 311 (FIG. 3a). Unlike the signal shown in FIG. 2c, signal 340 has no demodulation at the input of power amplifier 311. This absence of demodulation is due to TR2 being turned on while the pulse width modulated signal is inactive. In embodiments of the present invention, TR2 prevents demodulation by providing an effective AC ground to the input of matching network 302. Without transistor TR2, the series combination of C1, C2, C3 and L1 form a series resonant LC circuit. Without TR2 to ground C3 while TR1 is shut off, this series resonant circuit will cause ringing and demodulation of the PWM signal. TR2 effectively shunts any potential demodulated signal to ground while TR1 is turned off.

In alternative embodiments of the present invention, TR2 could be replaced by a non-switched path to ground such as a shunt resistor, or a cascode bias stage.

In further alternative embodiments of the present invention, additional power efficiency can be obtained by designing power amplifier 311 to be conditionally stable at impedances where TR1 or TR2 is on. Without transistor TR2, power amplifier 311 is exposed to a wider range of impedances (i.e. the output impedance of TR1 when it is conducting current versus the output impedance of TR1 when it is not conducting current). With transistor TR2, however, the impedance that power amplifier 311 sees at its input does not vary as much because TR2 is switched on while TR1 is not conducting. The design of power amplifier 311 is, therefore, simplified because power amplifier 311 is no longer required to remain stable over a very wide range of input impedances. With embodiments of the present invention unconditional stability over all impedances can be effectively traded off for increased gain and power efficiency.

In embodiments of the present invention, switched-mode amplifier 300 is implemented with discrete 28V CMOS LDMOS devices. The sources of these LDMOS devices may be coupled to ground and are packaged to allow direct heat transfer. In alternative embodiments of the present invention, however, other devices can be used. The present invention can also be implemented in a fully integrated configuration, where both amplifier stages share the same substrate. In further embodiments, the devices in switched-mode amplifier 300 may even share the same substrate as other circuits in the system, such as signal generator 102 (FIGS. 1a and 1b) and other RF and baseband system components.

Figure 4:
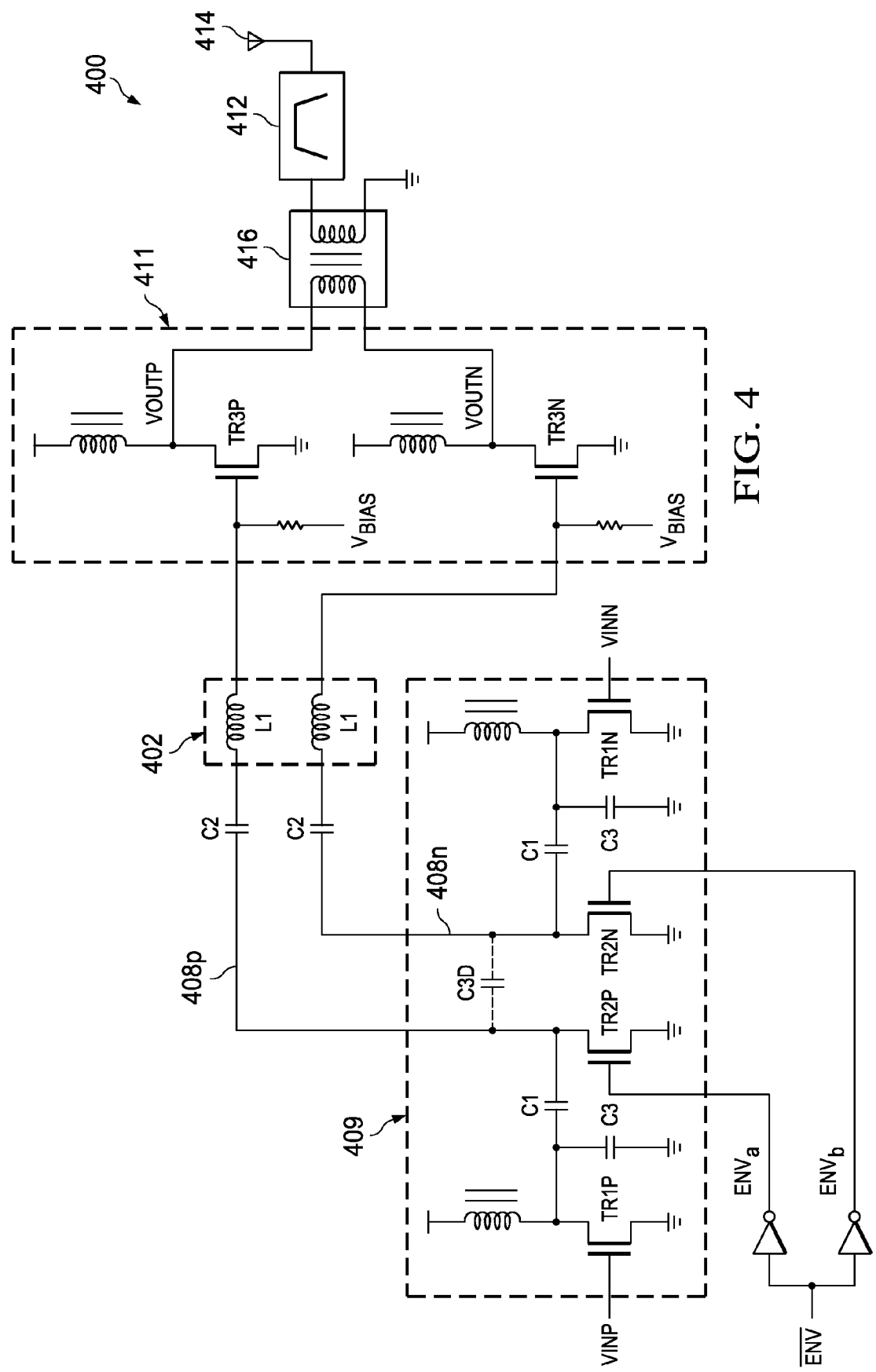
FIG. 4 illustrates a PWM amplifier circuit according to another embodiment of the present invention.

Another embodiment of switched-mode amplifier 400 is shown in FIG. 4. Switched-mode amplifier 400 is a pseudo-differential version of switched-mode amplifier 300 (FIG. 3a). In the embodiment of FIG. 4, preamplifier 409, matching network 402, and power amplifier 411 are each implemented by doubling the number components in a pseudo-differential fashion. For example, input transistor TR1 (FIG. 3a) is partitioned into input transistors TR1P and TR1N which are driven differentially at VINP and VINN during the periods in which the PWM signal is active. During periods in which the PWM signal is not active, however, VINP and VINN are both brought below the threshold of transistors TR1P and TR1N. Transistor TR2 (FIG. 3a) is partitioned into transistors TR2P and TR2N, which are both activated by signals ENVa and ENVb as described herein above. For example, both TR2P and TR2N are both turned on when the input signal is not active and when transistors TR1P and TR1N are turned off.

Because switched-mode amplifier 400 is driven differentially, components C3 can also be merged to one capacitor C3D placed between nodes 408n and 408p in alternative embodiments of the present invention. The value of the merged capacitor C3D is then one-half the value of C3. Power amplifier 411 effectively contains two single ended power amplifiers, each coupled to a positive and negative phase of preamplifier 409 and matching network 402. In embodiments of the present invention, high-order bandpass filter 412 is a single ended filter, therefore balun 416 is required to convert differential signal VOUTN to a single ended signal.

The pseudo-differential switched-mode amplifier 400 is advantageous because second order distortion caused by active devices TR1P, TR1N, TR3P and TR3N can be canceled out, as is well known in the art. In addition, a doubling of the available voltage swing is possible within a particular power supply voltage which is advantageous and helpful in achieving the required high output powers. Furthermore, pseudo-differential switched-mode amplifier 400 is advantageous because, unlike fully differential implementations, sources of devices TR1P, TR1N, TR2P, TR2N, TR3P and TR3N can be directly coupled to ground. Direct coupling to ground improves quality of AC ground available, and allows for more optimal heat transfer and power efficiency. In alternative embodiments of the present invention, however, a fully differential version of the switched-mode amplifier 400 may be used.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A system for amplifying a burst mode RF signal, the system comprising:
   a first amplifier, the first amplifier configured to amplify the burst mode RF signal provided at an input of the first amplifier;
   a second amplifier having an input coupled to the output of the first amplifier; and
   a switchable impedance element coupled to the output of the first amplifier and to an input of the second amplifier, wherein the switchable impedance element is configured to comprise a first impedance when the burst mode RF signal is active and to comprise a second impedance when the burst mode RF signal is inactive.

2. The system of claim 1, wherein the switchable impedance element is controlled by an envelope of the burst mode RF signal.

3. The system of claim 1, further comprising a matching network coupled between the output of the first amplifier and an input of the second amplifier.

4. The system of claim 1, wherein the switchable impedance element comprises a transistor.

5. The system of claim 4, wherein the transistor comprises an LDMOS transistor.

6. The system of claim 4, wherein the transistor comprises a MOS transistor.

7. The system of claim 1, wherein the second amplifier comprises a power amplifier.

8. The system of claim 1, further comprising a controller to shut down the first amplifier when the burst mode signal is inactive.

9. The system of claim 1, wherein the first amplifier and the second amplifier comprise differential amplifiers.

10. The system of claim 9, wherein the differential amplifiers comprise pseudo-differential amplifiers.

11. The system of claim 9, wherein the switchable impedance element comprises a plurality of switchable impedances.

12. The system of claim 1, further comprising a plurality of driver amplifiers, a plurality of second amplifiers, and a plurality of switchable impedance elements.

13. The system of claim 12, wherein the plurality of driver amplifiers and the plurality of second amplifiers are coupled in series.

14. A burst mode amplification circuit comprising:
   a first amplifying stage comprising an input coupled to a switched RF source;
   a switchable impedance element coupled to an output of the first amplifying stage to impose a first impedance when the switched RF source is active and to impose a second impedance when the switched RF source is inactive; and an output stage having an input coupled to the output of the first amplifying stage and to the switchable impedance element.

15. The circuit of claim 14, wherein the first amplifying stage comprises a first transistor coupled to the switched RF source, and wherein the switchable impedance element comprises a second transistor, the second transistor being shut off when the switched RF source is active and being turned on when the switched RF source is inactive.

16. The circuit of claim 15, further comprising a matching network coupled between the output of the first transistor and an input of the output stage.

17. The circuit of claim 16, wherein the switched RF source is implemented to provide a burst mode modulated signal, and wherein the second transistor is implemented to prevent the matching network from demodulating the burst mode modulated signal provided by the switched RF source.

18. The circuit of claim 15, further comprising a controller to shut off the first transistor when the switched RF source is inactive.

19. The circuit of claim 18, wherein an impedance of the second transistor when the second transistor is on is about the same as, or at least within an order of magnitude of, an impedance of the first transistor when the first transistor is on.

20. The circuit of claim 19, wherein the impedance of the second transistor when the second transistor is on is between about 5 ohms and about 20 ohms.

21. The circuit of claim 14, wherein the output stage comprises a power amplifier.

22. A method of amplifying a burst mode signal, the method comprising:
providing the burst mode signal to a first amplifier;
coupling a switchable impedance element to an output of the first amplifier;
controlling the switchable impedance element, wherein controlling comprises
causing the switchable impedance element to assume a first impedance when the burst mode signal is active, and
causing the switchable impedance element to assume a second impedance when the burst mode signal is inactive; and
coupling an input of a second amplifier to the output of the first amplifier and to the switchable impedance element.

23. The method of claim 22, further comprising disabling the first amplifier when the burst mode signal is inactive.

24. The method of claim 22, further comprising coupling a matching network between the output of the first amplifier and an input of the second amplifier, wherein a total impedance driving the matching network is dominated by an output impedance of the first amplifier when the burst mode signal is active, and wherein the total impedance driving the matching network is dominated by the second impedance when the burst mode signal is inactive.

25. The method of claim 22, wherein:
the first impedance comprises a high impedance; and
the second impedance comprises an impedance within an order of magnitude of the output impedance of the first amplifier when the burst mode signal is active.

26. The method of claim 22, further comprising coupling an antenna to an output of the second amplifier.

27. The system of claim 1, wherein an output of the second amplifier is configured to be coupled to an antenna.

28. The circuit of claim 14, wherein an output of the output stage is configured to be coupled to an antenna.

* * * * *